(12) United States Patent  
Hsieh

(10) Patent No.: US 8,835,958 B2  
(45) Date of Patent: Sep. 16, 2014

(54) LIGHT EMITTING DIODE PACKAGE WITH IMPROVED OPTICAL LENS STRUCTURE

(75) Inventor: Yu-Lun Hsieh, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/600,142

(22) Filed: Aug. 30, 2012

(65) Prior Publication Data

US 2013/0161672 A1 Jun. 27, 2013

(30) Foreign Application Priority Data

Dec. 27, 2011 (CN) .......................... 2011 1 0443716

(51) Int. Cl.  
*H01L 33/00* (2010.01)  
*H01L 31/0203* (2014.01)

(52) U.S. Cl.  
USPC ........ 257/98; 257/99; 257/100; 257/E33.074; 257/E33.073

(58) Field of Classification Search  
USPC ............... 257/98–100, E33.074, E33.073; 385/33, 34, 53, 74; 359/726  
See application file for complete search history.

(56) References Cited

U.S. PATENT DOCUMENTS

2006/0273338 A1* 12/2006 Lee et al. .................. 257/99

FOREIGN PATENT DOCUMENTS

| CN | 102141215 A | * | 8/2011 |
| JP | H06-38268 U | | 5/1994 |
| JP | 2010-186657 A | | 8/2010 |
| JP | 2011-171693 A | | 9/2011 |

* cited by examiner

*Primary Examiner* — Jose R Diaz  
(74) *Attorney, Agent, or Firm* — Novak Druce Connolly Bove + Quigg LLP

(57) ABSTRACT

An LED package includes a substrate, two electrodes, an LED die and a lens. The substrate includes a top surface, a bottom surface, a plurality of side surfaces interconnecting the top surface with the bottom surface, and two opposite notches depressed downward from lateral peripheral portions of the top surface. The two electrodes penetrate through the substrate, and each of the two electrodes is exposed at both the top surface and the bottom surface of the substrate. The LED die is arranged on the substrate and electrically connected to the two electrodes. The lens is arranged on the substrate and covers the LED die. The lens includes a contacting surface adjoining the top surface of the substrate, and two protrusions extending from lateral peripheral portions of the contacting surface and respectively embedded in the two notches.

6 Claims, 3 Drawing Sheets

LIGHT EMITTING DIODE PACKAGE WITH IMPROVED OPTICAL LENS STRUCTURE

BACKGROUND

1. Technical Field

The present disclosure generally relates to semiconductor packages, and particularly to a light emitting diode (LED) package which has an improved optical lens structure.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

The LED package generally includes a substrate, an LED die arranged on the substrate, and a lens adhered on the substrate by glue to adjust light from the LED die. However, the lens is usually configured very thin to satisfy compact requirement of the LED package. Accordingly, a contact area of the lens and the substrate is quite small, thereby leading to inadequate bond strength and unsatisfied reliability thereof.

Therefore, it is necessary to provide an LED package to overcome the above-mentioned shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe an exemplary embodiment of the present LED package.

Figure 1:
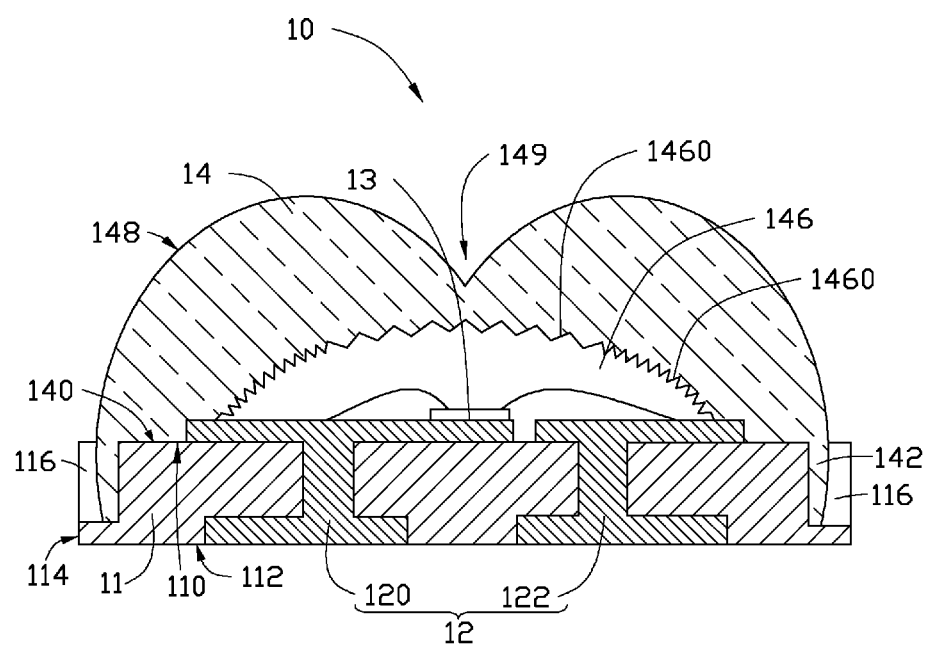
FIG. 1 is a schematic, cross-sectional view of the LED package in accordance with an exemplary embodiment of the present disclosure.
Figure 2:
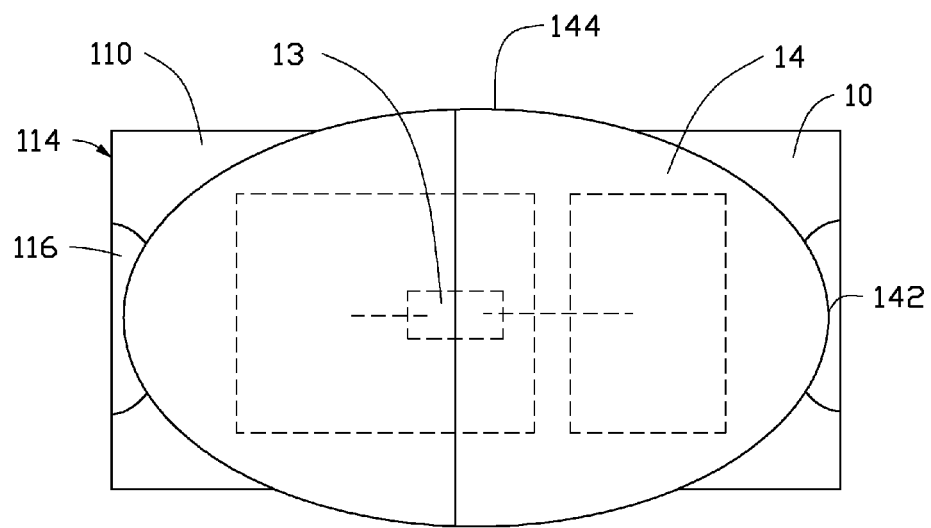
FIG. 2 is a schematic, top view of the LED package of FIG. 1.
Figure 3:
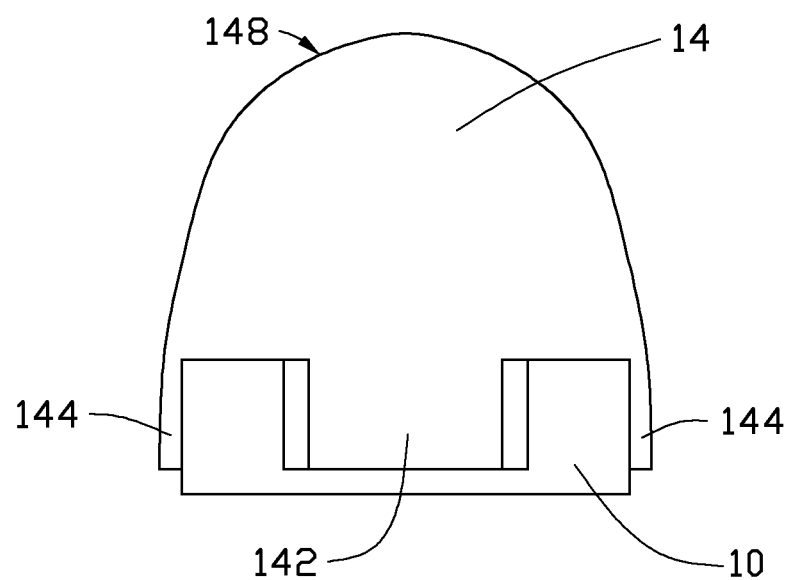
FIG. 3 is a schematic, side view of the LED package of FIG. 1.

Referring to FIG. 1 and FIG. 2, an LED package 10, in accordance with an exemplary embodiment of the present disclosure, includes a substrate 11, two electrodes 12, an LED die 13 and a lens 14.

The substrate 11 can be made of a circuit board such as a metal-cored printed circuit board (MCPCB). The substrate 11 includes a top surface 110, a bottom surface 112, and four side surfaces 114 each interconnecting the top surface 110 with the bottom surface 112. Two notches 116 are configured depressed downward from opposite lateral peripheral portions of the top surface 110. In this embodiment, the top surface 110 has a rectangular shape, and the two notches 116 are configured at two opposite short sides of the rectangle.

The two electrodes 12 each penetrate through the substrate 11, and each electrode 12 is exposed at both the top surface 110 and the bottom surface 112 of the substrate 11. In this embodiment, the two electrodes 12 are designated herein as a first electrode 120 and a second electrode 122, each of which has an I-shaped configuration in cross section. The first electrode 120 and the second electrode 122 each have a top higher than the top surface 110 and a bottom flushed with the bottom surface 112. It is to be said that, the first and second electrodes 120, 122 are not limited to be the I-shaped configuration, and the tops thereof are also not limited to be higher than the top surface 110 of the substrate 11.

The LED die 13 is arranged on the substrate 11 and electrically connected to the electrodes 12. In this embodiment, the LED die 13 is arranged on the first electrode 120 and electrically connected to the first and second electrodes 120, 122 by electrically conductive wires (not labeled).

The lens 14 is arranged on the top surface 110 and covering the LED die 13. The lens 14 includes a contacting surface 140 adjoining the top surface 110. Two protrusions 142 extend from two opposite lateral peripheral portions of the contacting surface 140. The protrusions 142 are respectively embedded into the two notches 116. In this embodiment, the lens 14 has a profile of an ellipse as viewed from a top thereof, with a major axis parallel to long sides of the rectangle-shaped top surface 110, and a minor axis parallel to short sides of the rectangle-shaped top surface 110. Accordingly, the two protrusions 142 extend from two ends of the major axis of the lens 14. When embedded in the notches 116, the protrusions 142 keep in contact with the substrate 11 defining the inner sides of the notches 116 and the contacting area of the lens 14 and the substrate 11 is increased, whereby the bond strength therebetween is increased. It is to be said that, in this embodiment, the protrusions 142 are configured to, but not limited to, extend perpendicularly from the contacting surface 140.

The lens 14 can further includes two clamping portions 144 extending from two ends of the minor axis of the ellipse-shaped lens 14, downwardly extending beyond the contacting surface 140. The two clamping portions 144 extend towards the bottom surface 112 of the substrate 11. The clamping portions 144 keep in contact with two opposite longitudinal side surfaces 114 of the substrate 11, thereby clamping the substrate 11 from two lateral sides and increasing bond strength between the lens 14 and the substrate 11 further.

Furthermore, the lens 14 includes a recess 146 recessed upwardly from a bottom face thereof, for accommodating the LED die 13 at a center thereof. The recess 146 is depressed away from the substrate 11 and defining a curved inner surface functioning as a light incident surface of the lens 14 for the light emitted from the LED die 13.

Still further, the lens 14 can includes a plurality of cone-like protrusions 1460 extending from the inner surface of the lens 14 defining the recess 146 towards the LED die 13, thereby decreasing the amount of total internal reflection and increasing light extraction thereof. The cone-like protrusions 1460 can also be replaced by other shape of protrusions, as long as the inner surface of the lens 14 defining the recess 146 is rough.

The inner surface of the recess 146 has a roughness decreasing from a center towards a peripheral portion thereof. Accordingly, a central portion of the inner surface of the recess 146 has a light refraction capability larger than that of the peripheral portion of the inner surface of the recess 146. The difference of the light reflection capabilities of the different portions of the inner surface of the recess 146 can effectively redirect the light from the LED die 13 to side directions of the LED package 10, thereby achieving a uniform light distribution and a batwing-shaped light filed distribution.

In an exemplary embodiment, the heights and/or density of the protrusions 1460 decrease from a center of the inner surface of the recess 146 towards a peripheral portion of the inner surface of the recess 146, to achieve the batwing-shaped light field distribution of the LED package 10.

The lens 14 further includes a light output surface 148 convex upwardly away from the substrate 11. For further achieving the batwing-shaped light field distribution, the lens 14 can further have a depression 149 concave towards the LED die 13 at a center of a top of the light output surface 148.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package, comprising:
   a substrate with a top surface, a bottom surface, a plurality of side surfaces interconnecting the top surface with the bottom surface, and two opposite notches depressed downward from lateral peripheral portions of the top surface;
   two electrodes penetrating through the substrate, each of the two electrodes being exposed at both the top surface and the bottom surface of the substrate;
   an LED die arranged on the substrate and electrically connected to the two electrodes; and
   a lens arranged on the substrate and covering the LED die, the lens comprising a contacting surface adjoining the top surface of the substrate, two protrusions extending from lateral peripheral portions of the contacting surface and being respectively embedded in the two notches;
   wherein the contacting surface defines a recess at a center thereof, the recess accommodating the LED die therein, the recess being depressed away from the substrate and defining a curved inner surface for functioning as a light incident surface for the light emitted from the LED die;
   wherein the inner surface is rough;
   wherein a roughness of the inner surface decreases from a center of the inner surface towards a peripheral portion of the inner surface; and
   wherein the lens comprises a plurality of cone-like protrusions extending from the inner surface, the cone-like protrusions have different sizes, wherein the size of the cone-like protrusions at a central portion of the inner surface is larger than that at the peripheral portion of the inner surface.

2. The LED package of claim 1, wherein the top surface of the substrate has a rectangular shape, and the two notches are configured at two opposite short sides of the rectangle.

3. The LED package of claim 2, wherein the lens has a shape of an ellipse as viewed from a top thereof, with a major axis parallel to long sides of the rectangle and a minor axis parallel to the short sides of the rectangle, the two protrusions extending from two ends of the major axis and embedded in the notches.

4. The LED package of claim 3, wherein the lens further comprises two clamping portions extending from two ends of the minor axis of the lens, the two clamping portions clamping two opposite longitudinal side surfaces of the substrate.

5. The LED package of claim 1, wherein the lens comprises a convex light output surface protruding upwardly away from the substrate.

6. The LED package of claim 5, wherein a center of a top of the light output surface defines a depression concave towards the LED die.

* * * * *